United States Patent [19]

Beurrier

[11] Patent Number: 5,663,606
[45] Date of Patent: Sep. 2, 1997

[54] APPARATUS FOR POLING A PIEZOELECTRIC ACTUATOR

[76] Inventor: Henry Richard Beurrier, 817 Old Chester Rd., Far Hills, N.J. 07931

[21] Appl. No.: 529,275

[22] Filed: Sep. 15, 1995

[51] Int. Cl.$^6$ .................................................. H01L 41/22
[52] U.S. Cl. ........................................................... 310/357
[58] Field of Search ............................................... 310/357

[56] References Cited

U.S. PATENT DOCUMENTS

| | | | |
|---|---|---|---|
| 3,213,027 | 10/1965 | Fatuzzo et al. | 252/63.2 |
| 4,088,917 | 5/1978 | Martin et al. | 310/357 |
| 4,340,786 | 7/1982 | Tester | 179/110 A |
| 4,345,359 | 8/1982 | Micheron | 29/25.39 |
| 4,365,283 | 12/1982 | Radice | 361/233 |
| 5,045,747 | 9/1991 | Chen et al. | 310/357 |

FOREIGN PATENT DOCUMENTS 0071190   6/1977   Japan ................... 310/357

*Primary Examiner*—Thomas M. Dougherty
*Attorney, Agent, or Firm*—Herbert M. Shapiro

[57] ABSTRACT

Interleaved patterns of oppositely-poled regions are formed in a piezoelectric film by a technique in which an unpoled film is positioned between the pairs of an electromechanical apparatus with a pattern of like-poled electrodes movable into juxtaposition with the surfaces of the film which already includes on its surfaces the complementary (oppositely-poled) pattern of electrodes. In a second embodiment, a piezoelectric film is threaded about two drums with complimentary electrode patterns imbedded in the drum surfaces. The two patterns interleave with one another and are held at opposite potentials to impose the requisite poling pattern as a film wrapped about the drums moves in consecutive, but opposite directions. In a third embodiment, a piezoelectric film is positioned between two printed circuit boards which have complementary patterns of electrodes. The electrodes are held at suitable potentials while consecutive sections of the film are moved into position to be held between the "jaws" of the two printed circuit boards while the requisite poling pattern is imposed on each section of the film in turn.

13 Claims, 5 Drawing Sheets

5,663,606

1

APPARATUS FOR POLING A PIEZOELECTRIC ACTUATOR

FIELD OF THE INVENTION

This invention relates to apparatus for imposing a pattern of appositely poled regions in a piezoelectric film.

BACKGROUND OF THE INVENTION

U.S. Pat. No. 5,440,194 issued Aug. 8, 1995 and entitled "Piezoelectric Actuators" discloses a number of piezoelectric actuators each of which exhibits considerable physical movement by forming a plurality of discrete oppositely poled regions in a piezoelectric film and by connecting the regions into a sequence such that alternate regions produce incremental movements which are additive to one another because of the unique way in which the regions are connected, and the pattern of electrodes formed on opposite sides of the film for impressing the voltage patterns for operation.

Although the resulting products are inexpensive and satisfy significant industrial requirements, a high volume method for fabrication would achieve not only additional cost reductions, but also would result in the high levels of production necessary for satisfying the anticipated demand.

BRIEF DESCRIPTION OF THE INVENTION

In accordance with the principles of this invention, two techniques are disclosed which produce the requisite pattern of appositely poled regions for actuators of the type disclosed in the above-noted patent.

The first technique involves the formation of portions of the final electrode pattern which correspond to the positive poling potential are in operation. Electrodes defining those ares are formed on alternate sides of the film, connected in common to the positive poling potential, and positioned to interleave with the pattern on the opposing side of the film. Third and fourth electrode arrays are are not in contact electrically with the peizoelectric film and are connected in common to a negative poling potential.

The second of these techniques employs a simple mechanical fixture which produces the requisite pattern of oppositely poled regions prior to the formation of electrodes on the film.

One convenient apparatus for implementing the requisite mechanical fixturing employs first and second cylinders offset from one another and having embedded in the surfaces thereabout first and second patterns of electrodes which interleave with one another and which are held at an appropriate potential. A piezoelectric film is moved about the first, then the second cylinder such that the potential on the electrodes induces the requisite poling pattern first on one side of the film, and second, on the opposite side of the film, resulting in a continuous poling pattern having alternating poling directions.

2

Figure 4:
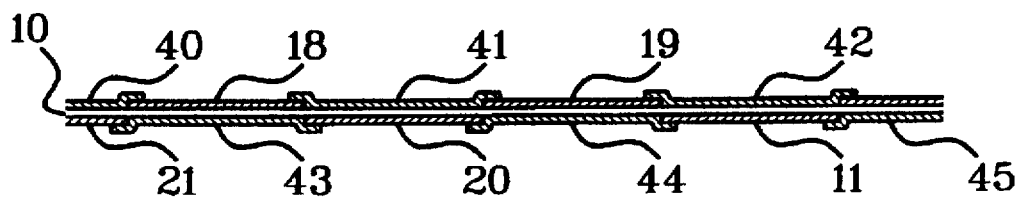
Figure 5:
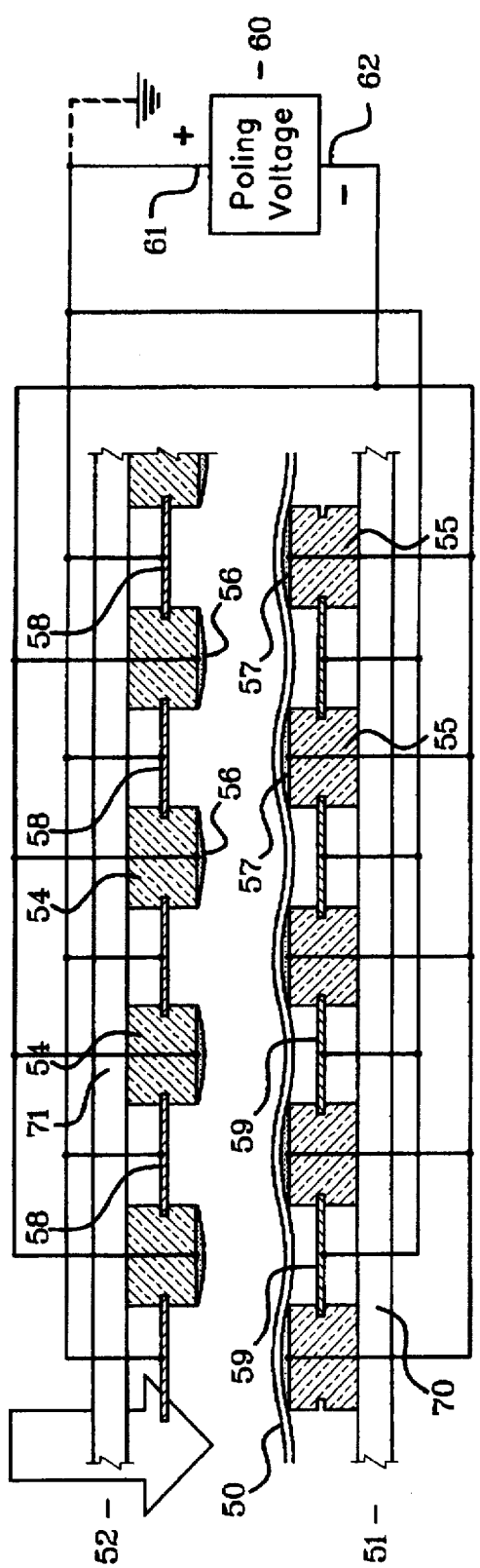
Figure 6:
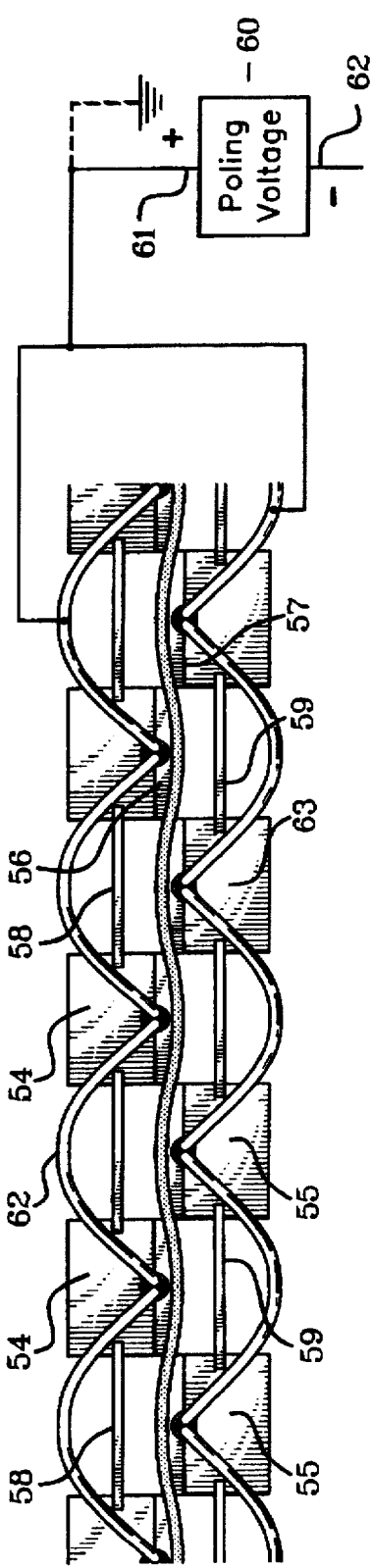
Figure 7:
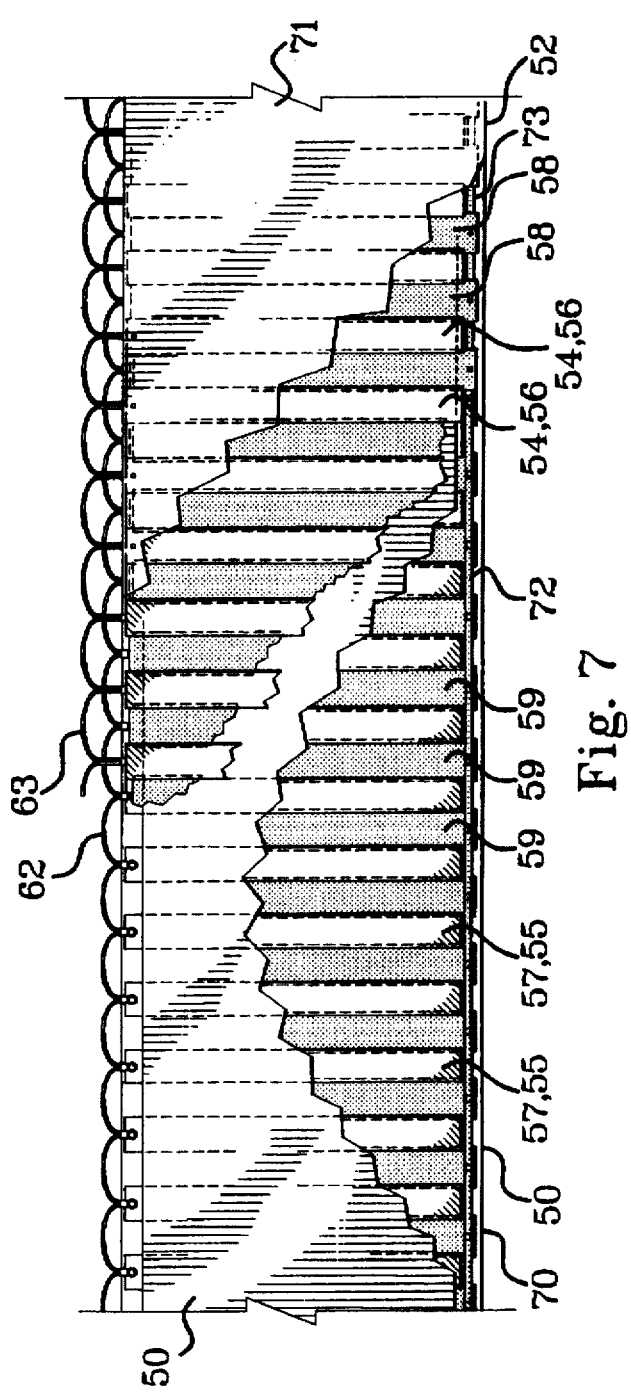
Figure 8:
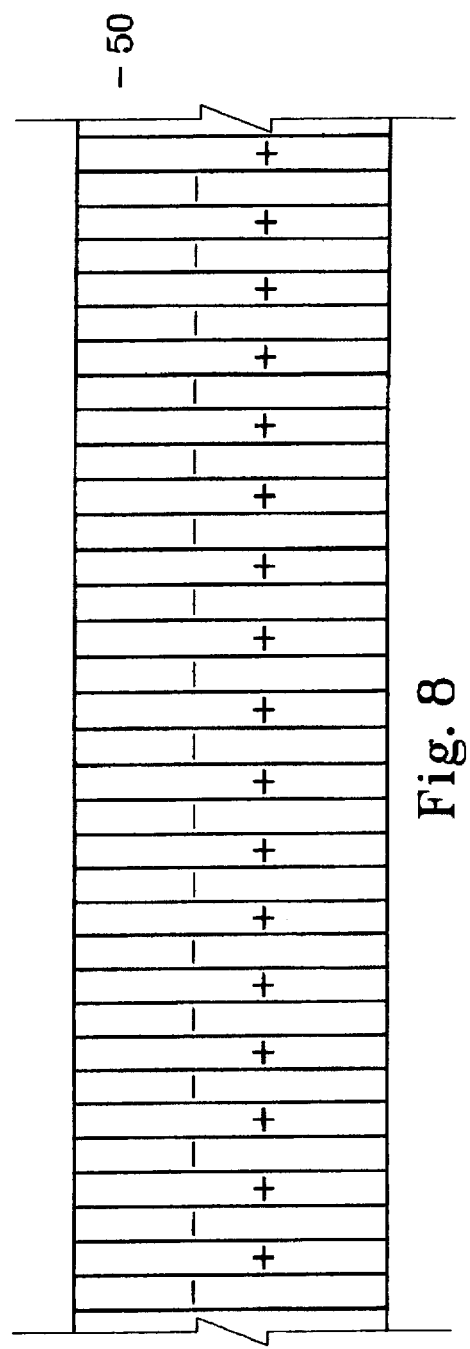
Figure 9:
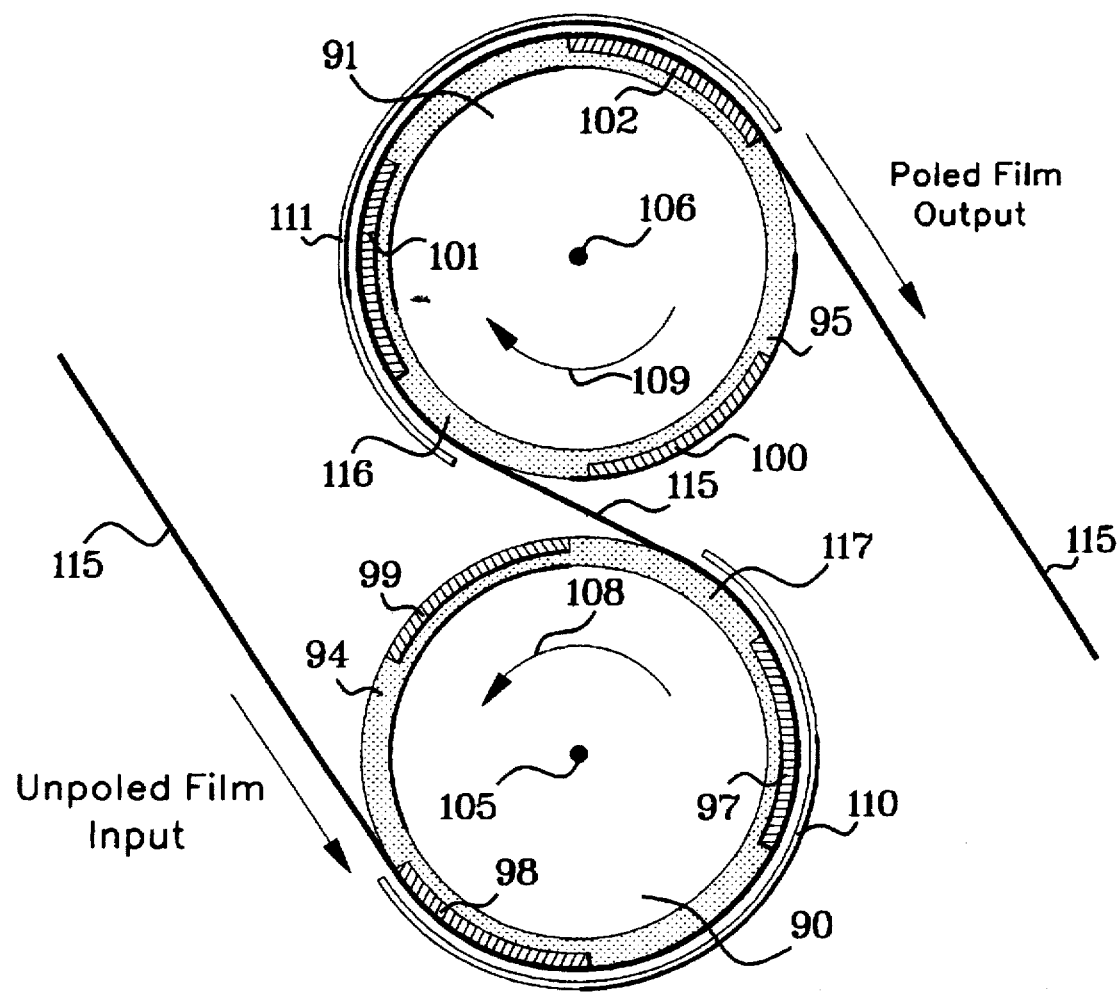
Figure 10:
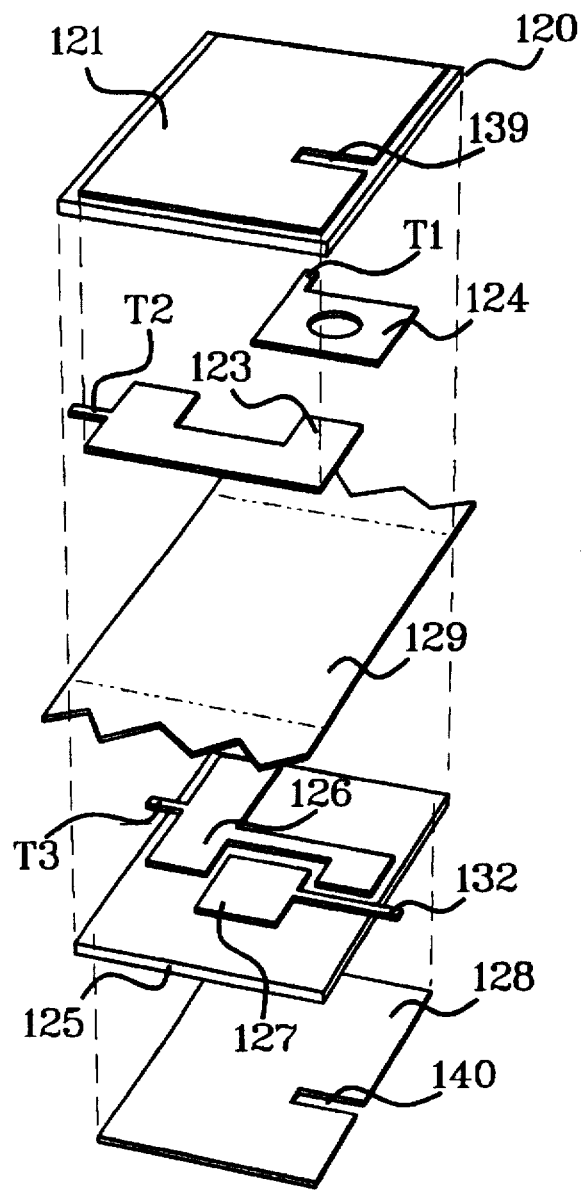
Figure 11:
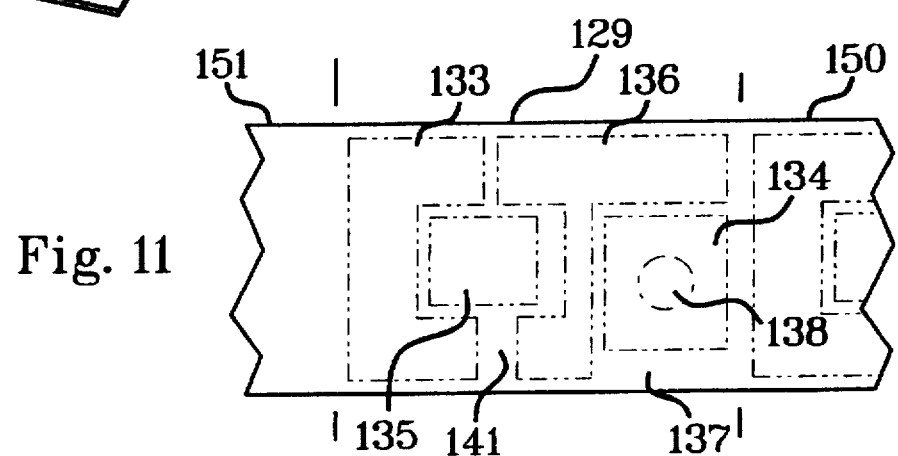

FIG. 4 is an enlarged, schematic side view of the final electrode patterns for an illustrative piezoelectric actuator;

FIG. 5 is an enlarged, schematic, cross sectional view of a piezoelectric film, having (optionally) no applied electrodes positioned between upper and lower electromechanical poling assemblies;

FIG. 6 is an enlarged, schematic side view of a wiring pattern for one of the upper or lower electromechanical poling assemblies of FIG. 5;

FIG. 7 is a schematic top view, partially cut away, of the electromechanical poling assemblies of FIG. 5;

FIG. 8 is an enlarged, schematic view of the poling pattern imposed in a piezoelectric film by the electromechanical poling assemblies of FIG. 5;

FIG. 9 is an enlarged schematic side view of a pair of cylinders, or drum, with imbedded electrodes for poling a piezoelectric film threaded thereabout for imposing a poling pattern as shown in FIG. 8 in accordance with a second embodiment of this invention; and FIGS. 10 and 11 are an exploded view of an alternative embodiment of this invention employing a printed circuit board (PCB) sandwich and a top view of the resulting film poling pattern, respectively.

DETAILED DESCRIPTION OF ILLUSTRATIVE EMBODIMENTS OF THIS INVENTION

Figure 1:
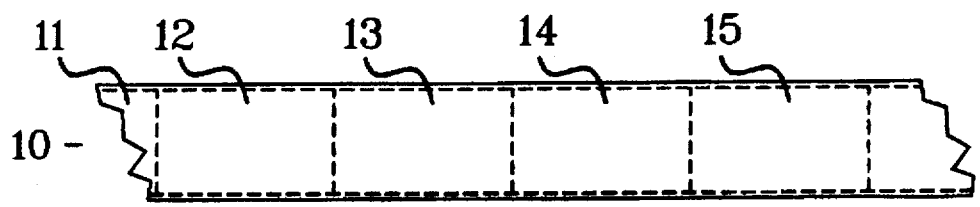
FIG. 1 shows an enlarged, schematic top view of a portion of a piezoelectric film with the requisite poling pattern for piezoelectric actuators of the type described in the above-identified patent.
Figure 2:
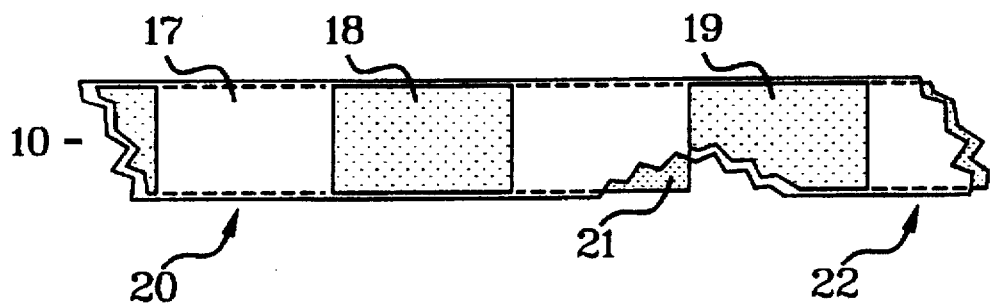
FIG. 2 is an enlarged, schematic view, partially cut away, of the first and second patterns of electrodes for such actuators.

FIG. 1 shows a portion 10 of a piezoelectric film having an ideal pole configuration comprising regions 11, 13 and 15 poled "positive up" and regions 12, 14 and 16 poled "positive down", as viewed in the figure. FIG. 2 shows the portion 10 of a piezoelectric film which is unpoled and having an ideal electrode pattern comprising electrodes 17, 18 and 19 on the top surface of portion 10 and electrode 20, 21, and 22 (interleaved) on the bottom surface of film 10 all connected in common with a positive poling voltage source. Electrodes 32 and 33, shown in FIG. 3, are spaced apart from the surface of film portion and are connected to a negative poling voltage source.

Figure 3:
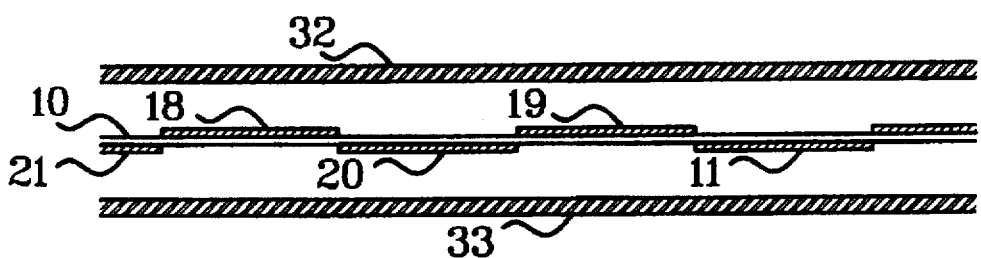
FIG. 3 is an enlarged schematic edge view of the electrodes of FIG. 2 along with applied electrodes separated from the film in accordance with a first embodiment of this invention.

In practice, the positive-poled electrodes of FIGS. 2 and 3 are formed on the first and second (top and bottom) surfaces of film (portion 10) and the film (portion) is poled by applying the positive voltage to electrodes 17 through 21 and the negative potential to the spaced apart electrodes (32 and 33). The piezoelectric film is now properly poled with a sequence of oppositely poled regions with (positive) electrode patterns which are alike and offset from one another (interleaved) as shown in FIG. 3. After poling of the film, electrodes 18 and 19 are connected by applying electrodes 40, 41 and 42 to form a continuous operating electrode on the top surface of film portion 10. Similarly, electrodes 43, 44 and 45 are applied to interconnect electrodes 20 and 21 to form a continuous electrode on the underside of film potion 10.

FIG. 5 shows, in schematic form, a side view of an aparatus for poling a film having no applied electrodes. The upper subassembly 52 is shown in a raised position, as it would be if the film were being loaded. In operation, subassembly 52 would be directly lowered to force the film, which is maintained in slight tension, into the wavelike shape shown. Specifically, FIG. 5 shows an edge or side view of a piezoelectric film 50 sandwiched between a lower electromechanical subassembly 51 and an upper electromechanical subassembly 52 which functionally correspond to electrodes 32 and 33 of FIG. 3. Electrical insulators 54 support positive poling electrodes (56) which abut film 50 on the film top side. Electrical insulators 55 support positive poling electrodes 57 which abut film 50 on the underside. Negative electrodes 58 and 59 are supported between adjacent insulators 54 and 55 and are seen to be spaced apart from film 50. All the positive poling electrodes 56 and 57 are connected, in common, to a source of positive voltage and all the negative poling electrodes 58 and 59 are connected, in common to a source of negative voltage (or ground). The positive and negative voltage sources are represented by block 60 and positive and negative terminals 61 and 62, as shown in FIGS. 5 and 6. Terminals 61 and 62 are shown connecting upper and lower subassemblies 52 and 51 to poling voltage source 60. Electrodes 57 are semi-cylindrical in shape to enhance electrical contact with the film.

FIG. 6 shows a schematic side view of the wiring pattern for the positive poling electrodes. The wiring connecting electrodes 56 and 57 appears as separate daisy chains 62 and 63 connected to all the upper positive poling electrodes 56 and all the lower positive poling electrodes 57 (as viewed). The wiring for the negative poling electrodes is implemented by straps 72 and by straps (not shown) on the opposite edge of electrodes 57 and 58.

FIG. 7 is a top view, partially cut away, of the major surfaces of subassemblies 51 and 52 and film 50. Lower positive electrodes 57 (as viewed in FIGS. 5 and 6) are shown distributed on lower insulators 55 with the insulators mounted on lower bed plate 70 (compare with components 11, 20 and 21 of FIG. 3). Upper insulators 54, supporting their respective positive electrodes 56, are shown mounted on the underside of upper bedplate 71. Straps 72 and 73 interconnect the negative electrodes 59 and 58 on the lower and upper subassemblies 70 and 71. The "daisy chain" wiring pattern for the positive poling electrodes (62 and 63) also is shown in FIG. 7.

FIG. 8 shows the poling pattern for film 50 resulting from the apparatus of FIGS. 5 through 7. The pattern can be seen to comprise a sequence of alternating positive and negative poled regions required for actuators of the type disclosed in the above-noted patent.

FIG. 9 shows an alternative apparatus for achieving continuous-process film poling. The figure shows an end view of first and second cylinders or drums 90 and 91. This embodiment is operative to properly pole a piezoelectric film prior to the formation of electrode patterns on the film. This is to be compared to the first embodiment which is operative to pole the film after one portion of the electrode pattern is in place. In accordance with the second embodiment herein, drums 90 and 91 have electrically insulating surfaces 94 and 95 respectively. Embedded in surfaces 94 and 95 are electrodes 97, 98 and 99 and electrodes 100, 101 and 102 respectively. The drum assemblies are synchronized to turn counter to one another about axes 105 and 106, drum 90 rotating counter-clockwise, as shown by arrow 108 and drum 91 rotating clockwise as shown by arrow 109. Non-contacting electrodes 110 and 111 partially encompass drums 90 and 91 respectively, and are functionally equivalent to negative electrodes 32 and 33 of FIG. 3 and electrodes 58 and 59 of FIGS. 5, 6 and 7.

The drum bodies (90 and 91) as well as electrodes 110 and 111 are connected electrically to the negative return of the poling voltage supply (see 60 of FIGS. 5 and 6) preferably ground. The distribution of electrodes about the drum surfaces is such that every other film region is poled in a first direction as film 115 is winched around drum assembly 90. The partially poled film is passed to the second drum assembly 91. Drum assembly 91 is separated from drum assembly 90 and is synchronized to pole the film in an opposite direction in regions between the regions poled by drum assembly 90.

In the instantaneous position of the drums, as shown in FIG. 9, drum 95 is wrapping the area of film 115 previously poled by electrode 99 onto insulated segment 116 of drum 90 where the film poling condition will remain unaltered. Rotating the drum another 90 degrees starts the wrapping of the opposite side of the unpoled film section, from section 117 of drum 90, onto positive electrode 100 of drum 95. It should be noted that in this arrangement, relative motion of the two drums and the film path results in electrodes 97, 98 and 99 being operative on the opposite side of the film from electrodes 100, 101 and 102 so that the film poling direction is reversed section to section. The spacing of the drum is set so that the trailing edge of section previously poled by electrode 99, for example, coincides with the leading edge of electrode 100. Continued rotation of the drums in this manner creates a continuous sequence of alternately poled areas on the film. Film 115 is advantageously held in tension and sprocketted to maintain good electrical and thermal contact and registry with the positive electrodes.

Further, heating of the positive electrodes heats the film 115, in contact therewith, to increase molecule mobility in film 115 leading to an increase in throughput and poling effectiveness.

It is clear from a comparison between the embodiment of FIGS. 1 through 7 and the embodiment of FIG. 9 that a sequence of alternating poled regions are formed in a piezoelectric film by apparatus including first and second patterns of electrodes having a positive poling voltage and a negative poling voltage impressed therein respectively where one pattern abuts the film and the other is spaced apart from the film. In the embodiment of FIG. 9, the electrodes of the two drums can be seen to interleave with one another, a positive electrode from drum 90 abutting one side of film 115 while another (negative) electrode (from drum 91) is spaced apart from the film. As the drums move, next an electrode from drum 91 abuts the opposite side of the film and electrodes in drum 90 are spaced apart from the film.

It is clear that each poling apparatus has it's particular process advantage. The embodiment of FIGS. 1 through 4 requires a minimum of hardware at the expense of an additional electrode application step. The embodiment of FIG. 9 has the advantage of continuous process at the expense of more complex hardware. The embodiment of FIGS. 5 through 7 lies between the above embodiments.

FIGS. 10 and 11 show an embodiment of this invention which employs printed circuit boards (PCB's). Specifically, FIG. 10 is an exploded view of a PCB sandwich. Upper PCB 120 is shown with a negative electrode 121 in place and with positive electrodes 123 and 124 separated from the underside of PCB 120 (exploded). Lower PCB 125 is shown with positive electrodes 126 and 127 in place and with lower negative electrode 128 separated from the underside of PCB 125 (exploded). Film 129, to be poled, is pressed between the two PCB's. Tabs T1, T2, T3 and T4 extend from the assembled sandwich to afford electrical connections. Areas 135 and 136 of FIG. 11, under the influence of (lower) contacting positive electrodes 126 and 127 working in conjunction with (upper) non-contacting negative electrode 121, are poled "P down". Areas 133 and 134 under the influence of (upper) contacting positive electrodes 123 and 124, working in conjunction with (lower) non-contacting electrode 128, are poled "P up". Area 141 of FIG. 11 is shown unpoled because even though the connecting tab T4 to electrode 127 is biased positive, there are no corresponding negative electrodes due to slots 139 and 140. Also area 138 remains unpoled similarly having been exposed only to equal negative fields.

FIG. 11 shows the net result of the poling operation. Areas 137, 138 and 141 are unpoled having been exposed to the negative poling field on both sides equally. Open areas (slots 139 and 140 in negative electrodes 121 and 128) inhibit poling of the area above tab 132 producing local unpoled area 141.

In operation, a film section is placed between PCB's 120 and 125 and poled. Thereafter, the film section is released and the film is advanced for the poling of the next consecutive section. The resulting poling of consecutive sections of the film is indicated in FIG. 11 by partial film sections 150 and 151.

What is claimed is:

1. Apparatus for forming a sequence of oppositely poled regions in a piezoelectric film having first and second surfaces, said apparatus including means for abutting against said first and second surfaces first and second like patterns of electrodes offset with respect to one another, said electrodes having a positive voltage impressed therein, said apparatus also including means spaced apart from said first and second surfaces and having a negative voltage impressed therein for generating a poling field at each position opposite a position abutted by an electrode of said first and second pattern.

2. Apparatus as in claim 1 wherein said means includes first and second drums, each of said drums having an electrically insulating surface and like patterns of electrodes embedded in said surface, said first and second drums being rotatable clockwise and counter-clockwise, respectively, about first and second parallel axes spaced apart from one another a distance such that said piezoelectric film threaded about said first and second drums abut an electrode of said first drum on said first surface thereof and, alternately, abuts an electrode from said second drum on said second surface thereof.

3. Apparatus as in claim 2 wherein said electrodes of said first and second drums are connected to a source of positive potential.

4. Apparatus as in claim 3 wherein each of said drums has associated therewith a spaced apart electrode, said film traveling between said spaced apart electrodes and the associated drum, said spaced apart electrode being connected to a source of negative potential.

5. Apparatus for forming a pattern of oppositely-poled regions in a piezoelectric film, said apparatus comprising first and second drums rotatable about first and second axes and having first and second electrically insulating surfaces respectively, said axes being parallel to one another and spaced apart such that said first and second surfaces are closely spaced apart from one another, first and second patterns of electrodes imbedded in said first and second surfaces respectively, said first and second patterns of electrodes being positioned so as to interleave with one another when said drums are rotated in synchronism, said apparatus including a voltage source for impressing positive voltage on the electrodes of said first and second patterns of electrodes respectively.

6. Apparatus as in claim 5 also including a film feed mechanism for wrapping said film counter-clockwise about said first drum and clockwise about said second drum.

7. Apparatus as in claim 6 also including a motor for rotating said drums about said first and second axes synchronously in a manner to abut an electrode from each of said first and second patterns of electrodes alternately against first and second surfaces of said piezoelectric film.

8. Apparatus as in claim 7 also including a voltage source for impressing a positive voltage on the electrodes of said first and second patterns of electrodes respectively for forming a sequence of oppositely-poled regions in said film.

9. Apparatus as in claim 8 wherein said first and second drums includes first and second electrodes about portions thereof, respectively, said first and second electrodes being maintained at a negative voltage.

10. Apparatus for forming a sequence of oppositely-poled regions in a piezoelectric film having first and second like patterns of electrodes on first and second surfaces thereof respectively, said first and second patterns being offset with respect to one another, said apparatus comprising first and second electrically insulating plates, each of said plates having a first surface, said first surfaces facing one another and being spaced apart to accept said film therebetween, said first and second surfaces including like patterns of electrodes where the electrodes of each of said first and second patterns are offset with respect to the electrodes on the opposing surface of a piezoelectric film to be poled, said apparatus also including a voltage source for impressing a positive voltage on said electrode on said film and a negative voltage on said like patterns of electrodes in said insulating plates.

11. Apparatus for forming a sequence of alternately poled regions in a film of piezoelectric material, said apparatus including first and second opposing insulating members having first and second surfaces respectively, and being spaced apart to accept a piezoelectric film therebetween, said first and second surfaces including like patterns of electrodes positioned to interleave with one another, said apparatus also including a voltage source for impressing positive voltages on said electrodes.

12. Apparatus as in claim 1 wherein said first and second complementary patterns of electrodes are formed on first and second printed circuit boards.

13. Apparatus as in claim 11 wherein said first and second opposing insulating members are first and second printed circuit boards.

* * * * *